United States Patent
Bae

(10) Patent No.: US 6,310,813 B1
(45) Date of Patent: Oct. 30, 2001

(54) METHODS AND APPARATUS FOR BYPASSING REFRESHING OF SELECTED PORTIONS OF DRAM DEVICES

(75) Inventor: Won-Il Bae, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/358,610

(22) Filed: Jul. 21, 1999

(30) Foreign Application Priority Data

Aug. 19, 1998 (KR) .................................................. 98-33643

(51) Int. Cl.[7] ...................................................... G11C 7/00
(52) U.S. Cl. ............................................. 365/222; 365/149
(58) Field of Search ................................... 365/222, 149; 395/137

(56) References Cited

U.S. PATENT DOCUMENTS

| | | |
|---|---|---|
| 5,751,930 * | 5/1998 | Katsura et al. ......................... 395/137 |
| 5,818,464 * | 10/1998 | Wade .................................... 345/501 |
| 6,167,484 * | 12/2000 | Boyer et al. .......................... 365/222 X |

* cited by examiner

Primary Examiner—Huan Hoang
(74) Attorney, Agent, or Firm—Myers Bigel Sibley & Sajovec

(57) ABSTRACT

Refreshing of a portion of a DRAM device is bypassed when carrying out a refreshing operation on the DRAM device. By bypassing the refreshing of a portion of the DRAM device when carrying out a refreshing operation, the operational speed of the DRAM device and of systems that use the DRAM device can be increased, and/or the power consumption thereof can be decreased. More specifically, graphic memory apparatus include a DRAM device that is divided into a frame buffer zone that supplies pixel data for a display and at least one other zone, such as a z buffer and/or a texture storing zone. Refreshing of the frame buffer zone is bypassed when carrying out a refreshing operation on the DRAM device. In a preferred embodiment, indications of a starting DRAM address and an ending DRAM address for the frame buffer may be stored. A refreshing operation is performed only on those DRAM addresses that fall outside the starting address and the ending address.

26 Claims, 6 Drawing Sheets

METHODS AND APPARATUS FOR BYPASSING REFRESHING OF SELECTED PORTIONS OF DRAM DEVICES

FIELD OF THE INVENTION

This invention relates to Dynamic Random Access Memory (DRAM) devices and controlling methods therefor, and more particularly to apparatus and methods for controlling the refreshing of DRAM devices.

BACKGROUND OF THE INVENTION

DRAM devices are widely used in consumer and commercial applications. As is well known to those having skill in the art, a DRAM device generally includes an array of memory cells, each of which includes one or more capacitors or other energy storage devices. Since charge generally leaks from the capacitors, it is well known that DRAM devices must be refreshed periodically, so as not to lose the data that is stored therein. Accordingly, DRAM devices generally are designed to be refreshed at a DRAM refreshing rate that is related to a DRAM refreshing time.

Unfortunately, DRAM refreshing operations may be time consuming, which can thereby reduce the overall speed of DRAM devices and of apparatus (systems) that employ the DRAM device. Moreover, DRAM refreshing generally consumes power which may reduce the operational time of battery-powered systems that employ DRAM devices.

DRAM devices often are used as part of a graphics card or other graphics system that may be used to display graphical data on a monitor. For example, graphics cards are widely used with personal computers to allow efficient display of static or animated graphical data on the monitor of the personal computer. As is well known to those having skill in the art, when DRAM devices are used as part of graphic display systems, the DRAM may be divided into a frame buffer that stores pixel data, a z buffer that is used to display three-dimensional data, and a texture storing zone that stores texture or other pattern data. As is also known to those having skill in the art, in a graphical display system, the monitor generally is refreshed periodically at a display refreshing rate, in order to allow smooth changes of animation data on the display and/or to account for the persistence characteristics of the display.

Due to the widespread use of DRAM devices, for example in connection with graphic display systems, it is desirable to provide improved DRAM devices and systems employing DRAM devices, that can reduce the impact of DRAM refreshing on overall speed and/or power consumption.

SUMMARY OF THE INVENTION

It is therefore an object of the present invention to provide improved DRAM devices such as are used in graphic memory apparatus, and methods of controlling the same.

It is another object of the present invention to provide methods and apparatus for controlling refreshing operations of DRAM devices that can reduce the power that is consumed by refreshing operations.

It is still another object of the present invention to provide DRAM devices and apparatus and methods for controlling DRAM devices that can reduce the time that is expended for refreshing operations.

These and other objects can be provided, according to the present invention, by bypassing the refreshing of a portion of a DRAM device when carrying out a refreshing operation on the DRAM device. By bypassing the refreshing of a portion of the DRAM device when carrying out a refreshing operation, the operational speed of the DRAM device and of systems that use the DRAM device can be increased, and/or the power consumption thereof can be decreased.

More specifically, graphic memory apparatus according to the present invention, include a DRAM device that is divided into a frame buffer zone that supplies pixel data for a display and at least one other zone, such as a z buffer and/or a texture storing zone. According to the present invention, refreshing of the frame buffer zone is bypassed when carrying out a refreshing operation on the DRAM device. Stated differently, at least one other zone is refreshed at a DRAM refreshing rate that is independent of a display refreshing rate. In contrast, the frame buffer zone is refreshed at the display refreshing rate that is independent of the DRAM refreshing rate. It has been recognized, according to the present invention, that the display refreshing operation takes place on the frame buffer at a display refreshing interval, so that it is not necessary to also refresh the frame buffer portion of the DRAM as part of the DRAM refreshing operation.

Accordingly, in contrast with conventional DRAM systems that may carry out a DRAM refresh operation on the entire DRAM, the present invention need only refresh those portions of the DRAM device that will not be refreshed as a result of the display refreshing operation. Stated differently, it has been recognized that the time that is expended for a screen refreshing operation generally is shorter than that for the DRAM refreshing operation. Accordingly, the DRAM cells that are the subject of the screen refreshing operation need not require a DRAM refreshing operation.

In a preferred embodiment of the present invention, indications of a starting DRAM address and an ending DRAM address for the frame buffer may be stored. A refreshing operation is performed only on those DRAM addresses that fall outside the starting address and the ending address. More specifically, a counter may be provided that counts in response to a clock signal, to produce a counter output signal. A comparator system compares the counter output signal to the starting address and to the ending address, to provide the counter output signal to an address decoder for the DRAM device when the output of the counter is outside the starting address and the ending address, and to withhold the counter output signal from the address decoder when the counter output is between the starting address and the ending address.

More preferably, the comparator system includes a first switching apparatus that transmits the stored indication of the ending address in response to a first signal, and a second switching apparatus that transmits the counter output signal in response to an inverted second signal. A first latching apparatus is responsive to the first and second switching apparatus to latch the indication of the ending address or the counter output signal. The address decoder is responsive to the first latching apparatus. A comparator is provided that compares the counter output signal and the indication of the starting address, to generate the second signal. Finally, an ANDing apparatus ANDs the clock signal and the second signal, to generate the first signal. High speed and/or reduced power refreshing operations for DRAM devices thereby may be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
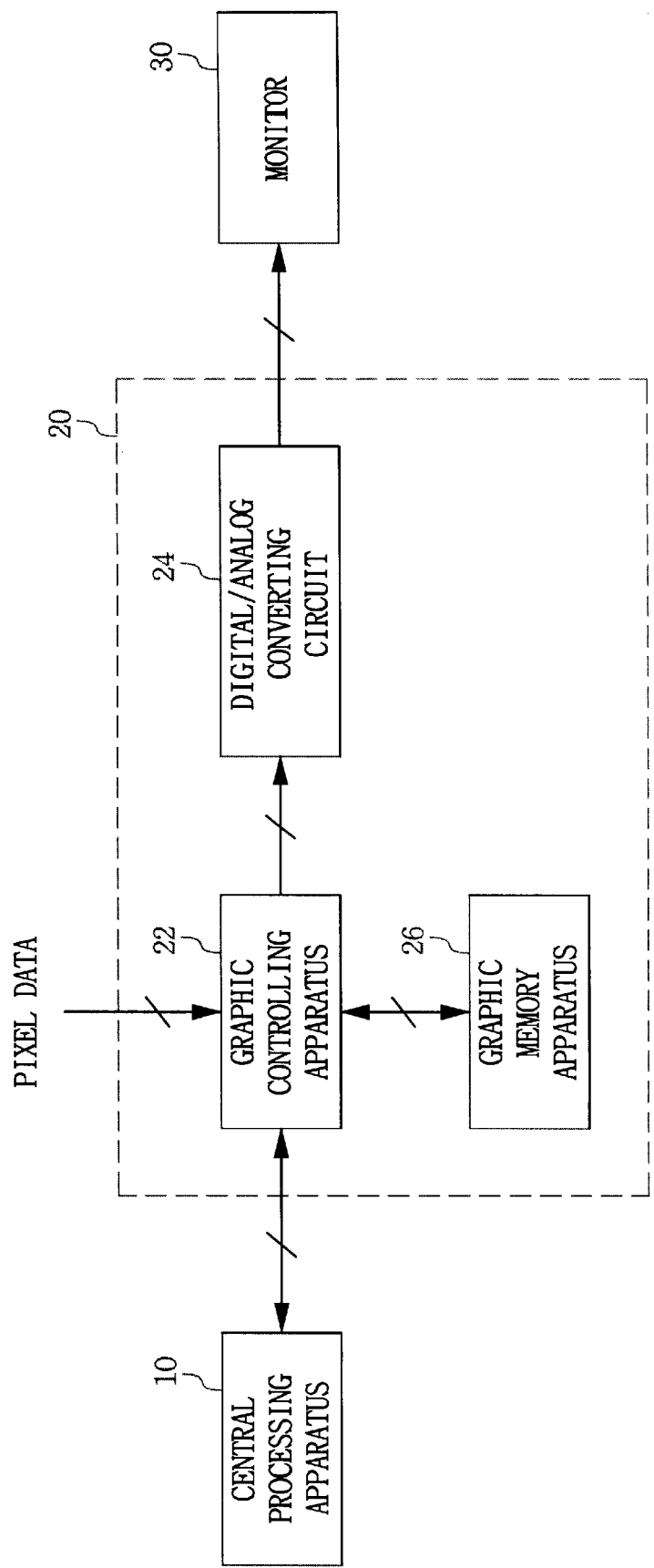
FIG. 1 is a block diagram of conventional graphic memory apparatus.

FIG. 1 is a block diagram of conventional graphic apparatus which include a central processing apparatus 10, a graphic card 20 and a monitor 30 (also referred to a display or a screen). The graphic card 20 includes a graphic controlling apparatus 22, a digital/analog converting circuit 24 and a graphic memory apparatus 26. It will be understood that one or more of the blocks of FIG. 1 may be integrated into one or more integrated circuit chips or onto a signal second level package such as a printed circuit board. Thus, for example, the elements of the graphic card 20 may be integrated into a single chip or a single printed circuit board along with the central processing apparatus 10.

The central processing apparatus 10 controls the graphic controlling apparatus 22 of the graphic card 20. The graphic memory apparatus 26 stores information for display and/or processing. The graphic controlling apparatus 22 stores pixel data in the graphic memory apparatus 26 under control of the central processing apparatus 10 and outputs the pixel data to the digital/analog converting circuit 24 by controlling the graphic memory apparatus 26. Furthermore, the graphic controlling apparatus 22 graphically processes the data stored in the z buffer zone, the texture storing zone and/or the frame buffer zone to output to the digital/analog converting circuit 20. The digital/analog converting circuit 24 converts the digital data input from the graphic controlling apparatus 22 into analog signals. The monitor 30 displays the analog signals transmitted from the analog/digital converting circuit 24.

Figure 2:
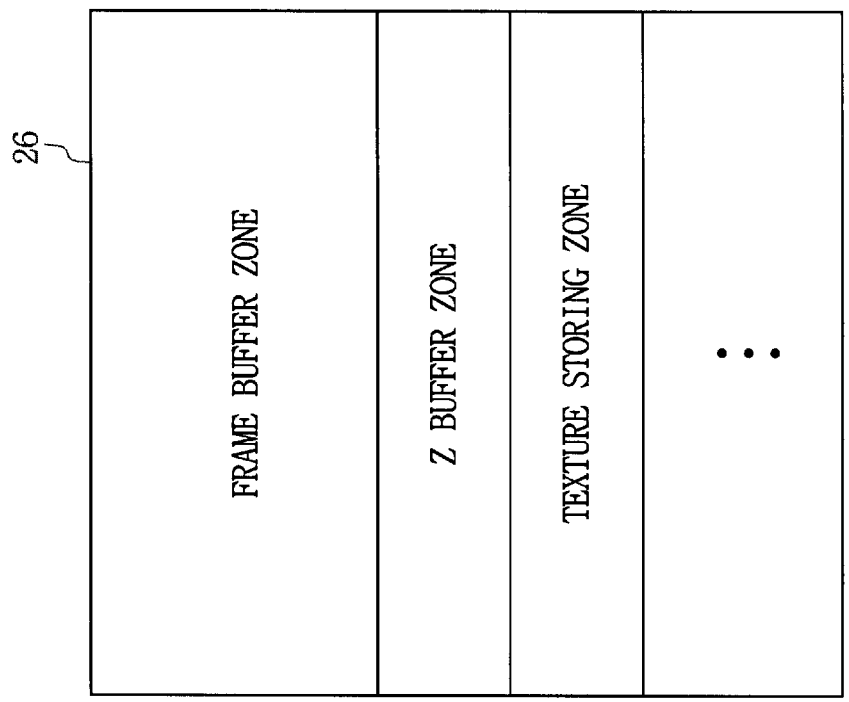
FIG. 2 is a memory map of a graphic memory apparatus shown in FIG. 1.

FIG. 2 is a memory map of the graphic memory apparatus 26 shown in FIG. 1. The graphic memory apparatus 26 is divided into a frame buffer zone, a z buffer zone, a texture storing zone, and other zones. The frame buffer zone stores frame data that may be obtained from the pixel data. The z buffer zone stores data to express the frame data in three-dimensional images. The texture storing zone stores data patterned with repeated images of the frame data for texture mapping and/or other applications.

In other words, data may be pre-stored in the z buffer zone and the texture storing zone, and the data to be displayed is stored in the frame buffer zone. Thus, the frame data stored in the frame buffer zone is periodically read by the screen refreshing operation to display on the monitor. The data stored in the z buffer zone and the texture storing zone generally is not periodically read. The design and operation of graphic apparatus, and of frame buffers, z buffers and texture buffers are well known to those having skill in the art, and need not be described further herein.

The present invention stems from a realization that a DRAM refreshing operation need not be performed for the frame buffer zone, because it is subject to screen refreshing. Thus, according to the invention, the screen refreshing operation may be performed for the data that is stored in the frame buffer zone, while the DRAM refreshing operation may be performed on the data stored in the other zones, preferably all the other zones except the frame buffer zone. DRAM refreshing for the frame buffer zone therefore may be bypassed, to allow decreased refreshing time and/or decreased power consumption.

Figure 3:
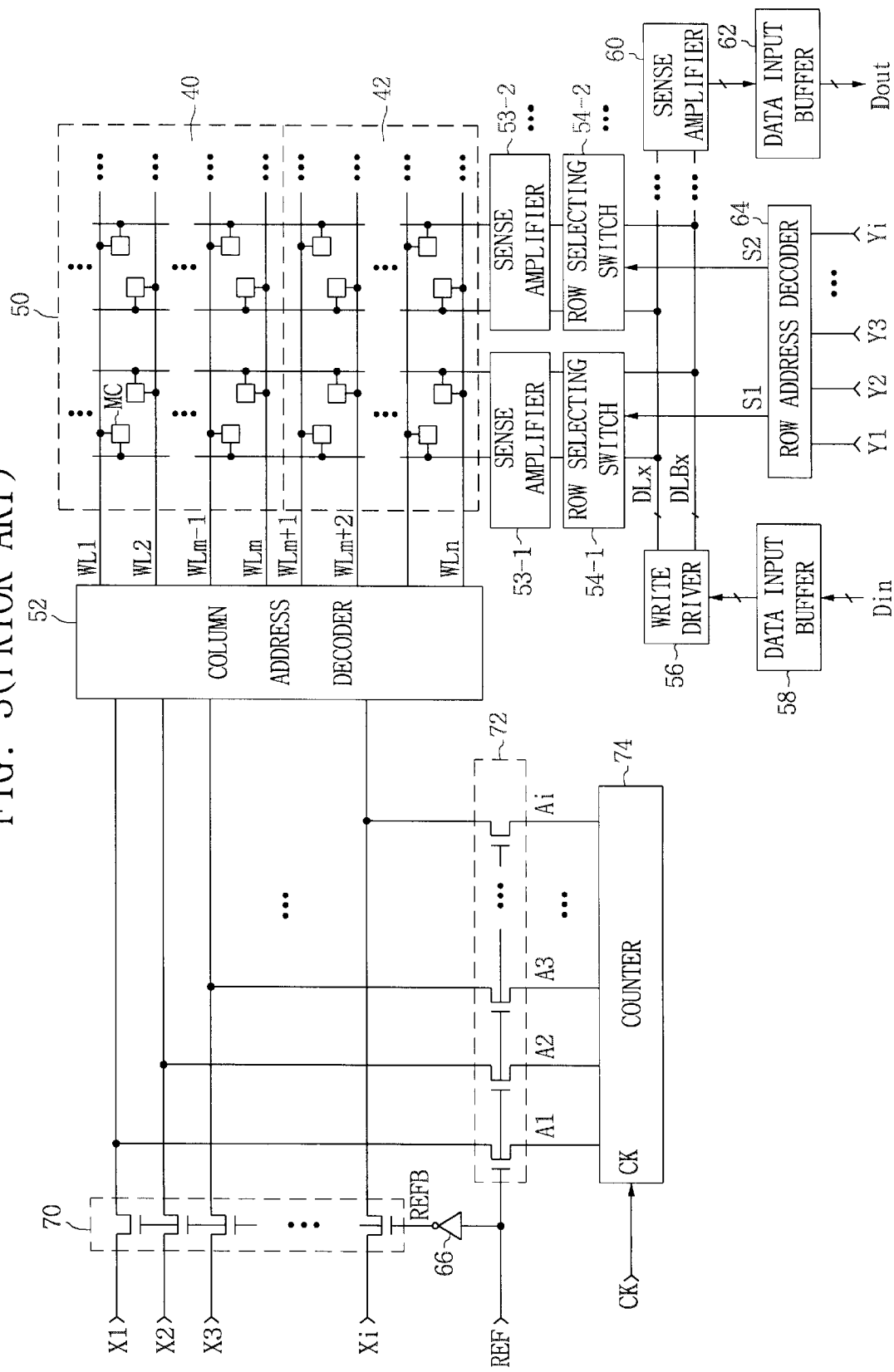
FIG. 3 is a detailed diagram of conventional graphic memory apparatus.

FIG. 3 is a detailed diagram of conventional graphic memory apparatus, which comprises an array of memory cells 50 with a frame buffer 40 and a DRAM refreshing zone 42 including the z buffer zone and the texture storing zone. The conventional graphic memory apparatus also includes a column address decoder 52, sense amplifiers 53-1, 53-2, ..., row selecting switches 54-1, 54-2, ..., a write driver 56, a data input buffer 58, a sense amplifier 60, a data output buffer 62, a row address decoder 64, an inverter 66, column address switches 70, refreshing address switches 72 and a counter 74.

Functions of the aforementioned parts now will be described. The array of the memory cells 50 includes the frame buffer zone 40 having DRAM memory cells (MC) connected between word line selecting signals WL1, WL2, ..., WLm-1, WLm and bit lines, and a DRAM refreshing zone 42 having the DRAM memory cells (MC) connected between word line selecting signals WLm+1, WLm+2, WLn and bit lines.

The column address decoder 52 decodes the column addresses to generate the word line selecting signals. The sense amplifiers 53-1, 53-2, ..., amplify the data transmitted to a pair of bit lines. The row selecting switches 54-1, 54-2, ..., select a pair of bit lines. The write driver 56 transmits data to a pair of complementary data lines DLx, DLBx. The data input buffer 58 buffers and transmits the input data Din to the write driver 56. The sense amplifier 60 amplifies the read data transmitted to a pair of data lines DLx, DLBx. The data output buffer 62 buffers and outputs the data amplified by the sense amplifier 60.

The row address decoder 64 decodes the row addresses to generate the row selecting signals S1, S2, .... The inverter 66 inverts a signal REF for controlling the refreshing operation to generate its complementary signal REFB. The column address switches 70 respond to the complementary signal REFB to transmit the column addresses X1, X2, ... Xi. The refreshing address switches 72 transmit refreshing addresses A1, A2, ... Ai in response to the signal REF. The counter 74 counts and generates the refreshing addresses A1, A2, ... Ai in response to a clock signal CK. The signal REF for controlling the refreshing operation and the clock signal CK generally are input from external controllers.

A conventional method for storing the frame data in the frame buffer zone 40 of the graphic memory apparatus shown in FIG. 3 now will be described. The graphic controlling apparatus 22 transmits a write command to the graphic memory apparatus 26 under control of the central processing apparatus 10. The graphic controlling apparatus 22 inputs pixel data to the graphic memory apparatus 26. The pixel data includes a predetermined bit or bits with information which corresponds to one pixel on the monitor 30. The graphic memory apparatus 26 stores the pixel data to be displayed in the frame buffer zone 42 at the same position as that on the monitor 30.

A write operation of the graphic memory apparatus now will be described. The column addresses X1, X2, ..., Xi and the row addresses Y1, Y2, ..., Yi input from the controlling apparatus 22 are transmitted through the column address switches 70 respectively to the column and row address decoders 52 and 64 respectively. The data input buffer 58 buffers and outputs the pixel data that was input from the graphic controlling apparatus 22. The write driver 56 transmits the buffered pixel data to the pair of data lines DLx, DLBx. Then, the word line selecting signal WL1 and its corresponding row selecting signals S1, S2, ... are enabled. The sense amplifiers 53-1, 53-2, ... amplify the pixel data in pairs of bit lines and write them at correspondingly selected memory cells. Therefore, the frame data is stored in the frame buffer zone by repeating the aforementioned write operation of the pixel data at the positions (addresses) which correspond to those on the monitor 30.

Now, a display refreshing operation will be described. The display refreshing operation reads the stored frame data at predetermined time intervals. After the frame data is stored in the frame buffer zone 40 as described above, the graphic controlling apparatus 22 sends a read command to the graphic memory apparatus 26. Then, the graphic memory apparatus 26 reads respective pixel data of the frame data in response to the read command and the column and row addresses and transmits that data to the graphic controlling apparatus 22. Then, the graphic controlling apparatus 22 calculates and transmits the pixel data to the digital/analog converting circuit 24, which converts the digital pixel data into the analog signals to scan on the monitor 30.

A read operation of the graphic memory apparatus 26 now will be described. The column addresses that are input from the graphic controlling apparatus 22 are transmitted through the column address switches 70 to the column address decoder 52 while the row addresses are transmitted to the row address decoder 64. The column and row address decoders 52, 64 decode the column and row addresses and select the memory cells MC of the frame buffer zone 40, which transmit the stored data to pairs of bit lines. The sense amplifiers 53-1, 53-2 ... amplify the data in pairs of bit lines. The row selecting switches 54-1, 54-2, ... transmit the data in pairs of bit lines to pairs of data lines. The sense amplifier 60 amplifies the pixel data in pairs of data lines. Then, the data output buffer 62 outputs the amplified data to the graphic controlling apparatus 22.

If the signal REF for controlling the refreshing operation becomes active (for example "HIGH" level) in the middle of the aforementioned operation, the other operations generally are delayed to perform the refreshing operation.

The DRAM refreshing operation now will be described. If the high level of signal REF for controlling the refreshing operation is input, the refreshing address switches 72 are turned on and the column address switches 70 are turned off. Therefore, the column and row addresses are not input from outside to the column and row address decoders 52, 64. Rather, the refreshing addresses A1, A2, ... Ai are input through the refreshing address switches 72 to the column address decoder 52.

A refreshing operation of a conventional graphic memory apparatus now will be described. The column address decoder 52 responds to the refreshing addresses counted by the counter 74 to serially enable the word line selecting signals WL1, WL2, ... WLm−1, WLm, WLm+1, WLm+2, ..., WLn.

If a word line selecting signal WL1 is selected, the memory cells MC connected to the word line transmit the write data in pairs of bit lines. The sense amplifiers 53-1, 53-2, ... respectively amplify the data in pairs of bit lines to write back in the memory cells MC selected by the word line selecting signal WL1, because the row selecting switches 54-1, 54-2, ... are turned off.

The aforementioned refreshing operation is sequentially carried out to all the memory cells MC in response to the word line selecting signals WL2, WL3 ..., WLn.

As described above, a refreshing operation may consume excessive power in the graphic memory apparatus, which can reduce the operational time of a battery-powered device. Moreover, the refreshing operation may adversely impact the performance of the graphic memory apparatus, due to the time that is used for the refreshing operation.

The present invention recognizes that power can be saved and that operational performance can be improved by bypassing refreshing of the frame buffer zone that already is refreshed as part of the screen refreshing process. Accordingly, DRAM refreshing operations need only be performed on those portions of the graphic memory apparatus, such as the z buffer zone and the texture storing zone, that are not refreshed by the screen refreshing operation.

Figure 4:
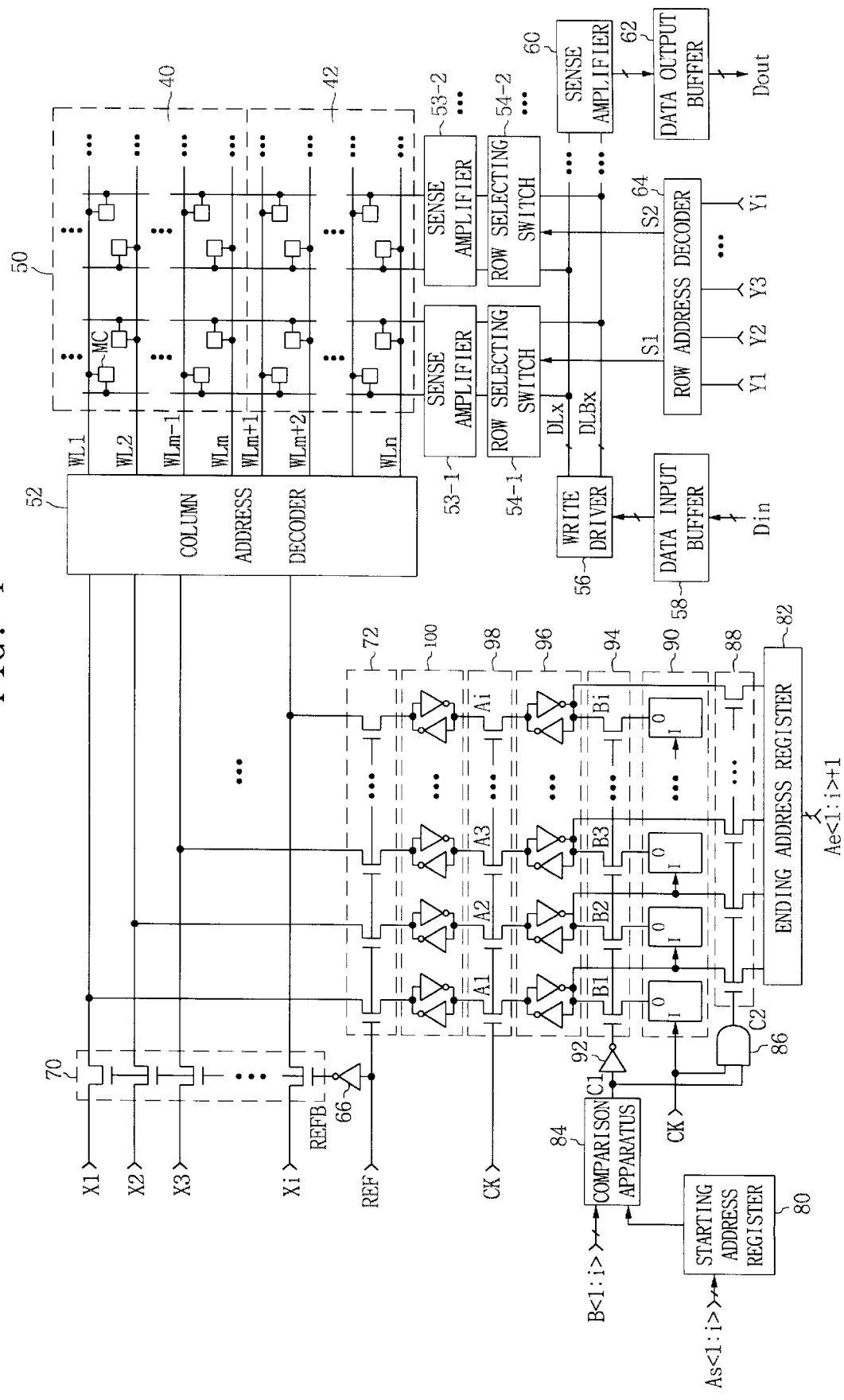
FIG. 4 is a detailed diagram of embodiments of methods and apparatus for controlling refreshing operations in accordance with the present invention.

FIG. 4 is a detailed block diagram of an embodiment of graphic memory apparatus and methods in accordance with the present invention. Instead of the counter 74 in FIG. 3, graphic memory apparatus and methods of the present invention can include a starting address register 80, an ending address register 82, a comparison apparatus 84, an AND gate 86, a counter 90, an inverter 92, switches 88, 94, 98 and latches 96, 100.

Operations for write, read and the display refreshing operation of the data in FIG. 4 may be the same as illustrated in FIG. 3. Accordingly, they will not be described again. However, a significant difference in the DRAM refreshing operational procedures may be provided, which will now be described.

While the graphic memory apparatus 26 is performing another operation, a "HIGH" level of the signal REF for controlling the refreshing operation may be input from the graphic controlling apparatus 22. In response, the column address switches 70 are turned off while the refreshing address switches 72 are turned on. Therefore, the column addresses are not transmitted while the refreshing addresses A1, ..., Ai are transmitted to the column address decoder 52. An indication of the starting and ending addresses in the zones where the DRAM refreshing operation is not required, such as the starting address and the ending address+1, are respectively stored in the starting and ending address registers 80, 82. It will be understood that registers 80 and 82 may be considered parts of a single register.

With the signal REF for controlling the refreshing operation, a clock signal CK is sent from the graphic controlling apparatus 22. Then, the counter 90 continuously counts up by 1 from "(MSB)000 ... 000(LSB)".

The comparison apparatus 84 compares the addresses (B<1:i>) and the starting addresses A<1:i>. The comparison apparatus 84 generates a "HIGH" level signal if these addresses are the same and generates a "LOW" level signal if these addresses are not the same. Until the signal output from the comparison apparatus becomes a "HIGH" level, the switches 94 are kept in their ON state. The counter output from the counter 90 is sent through the switches 94 to the latches 96. The switches 98 transmit the signals latched in the latches 96 in response to a "HIGH" level of the clock signal CK. The latches 100 latch the addresses B<1:i> that are output from the switch 98. The comparison apparatus 84 compares the addresses (B<1:i>) and the starting addresses (A<1:i>) and generates a "HIGH" level signal if they are same.

The inverter 92 inverts the "HIGH" level signal to generate a "LOW" level. The AND gate 86 ANDs (logically multiplies) a "HIGH" level of signals from the clock signal CK and from the comparison apparatus 84, to generate a "HIGH" level of the signal. Therefore, the switches 94 are turned off and the switches 88 are turned on, so that the ending address (Ae)<1:I>+1 latched in the ending address register 82 is stored through the switches 88 into the latches 96. Then, the switch 98 responds to a "HIGH" level of the clock signal CK to output the addresses latched in the latch 96 to the latches 100. The switches 72 output the addresses latched in the latches 100 to the column address decoder 52.

When the comparison apparatus 84 compares a signal output from the latches 96, the ending address+1 and a starting address, it generates a "LOW" level signal if they are not same. Therefore, the switches 94 are turned on and the switches 88 are turned off, and then the signal output from the counter 90 is latched through the switches 94 to the latches 96. The counter 90 counts an increase from the ending address +2, because a toggling signal is generated by inputting the signal latched at the latches 96. The switches 98 respond to a "HIGH" level of the clock signal CK to transmit the signal latched at the latches 96 to the latches 100. The transmission gate 72 outputs the signal latched at the latch 100 to the column address decoder 52.

In other words, in accordance with the present invention, as shown in FIG. 4, the DRAM refreshing operational procedures are not needed in the frame buffer zone 40 where only the screen refreshing operational procedures may be used. Therefore, the DRAM refreshing operation may be carried out in other zones 42 except the frame buffer zone 40.

Figure 5:
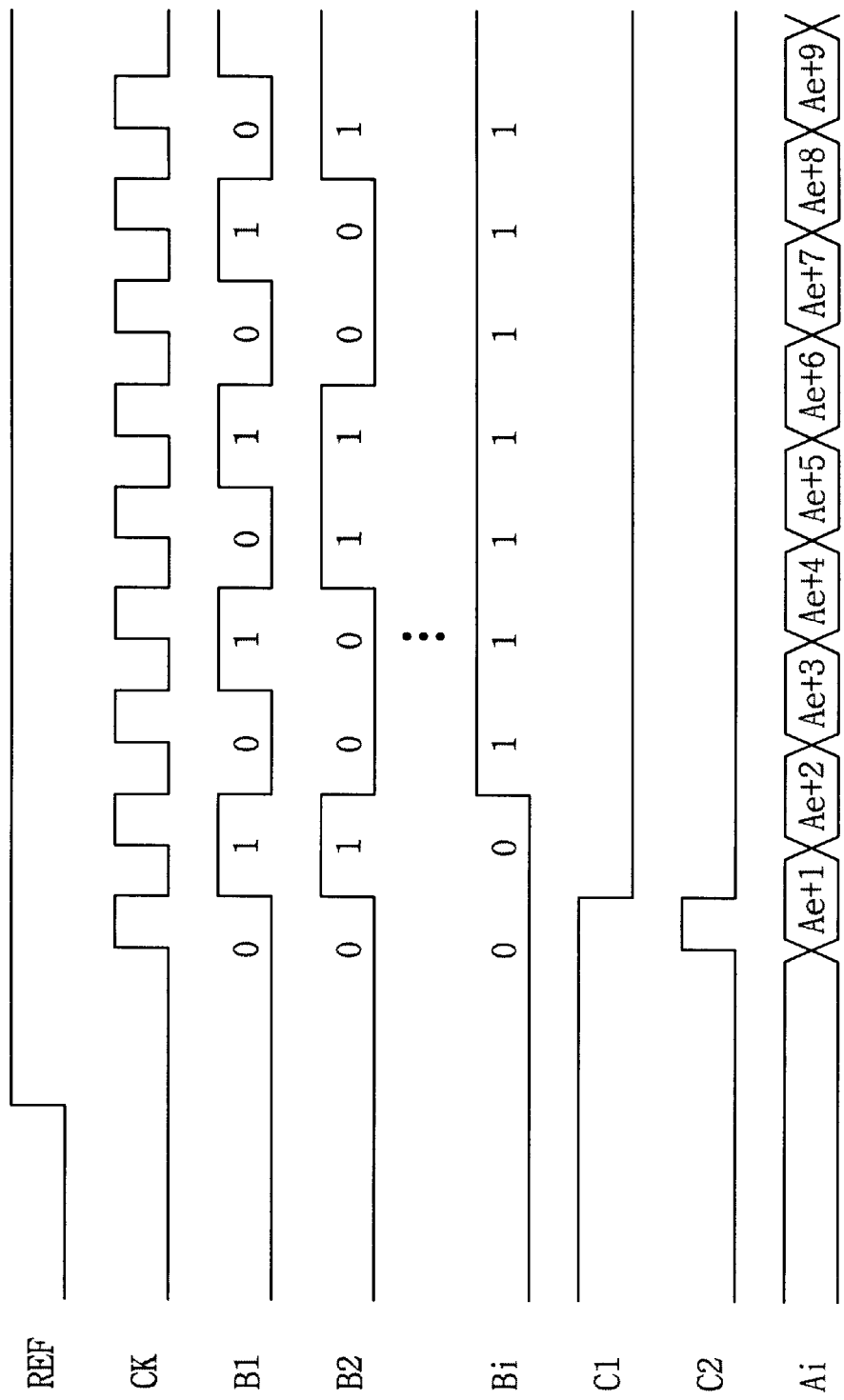
FIGS. 5 and 6 are operational timing diagrams illustrating DRAM refreshing operations in accordance with embodiments of the present invention shown in FIG. 4.

FIG. 5 is an operational timing diagram of refreshing operations in accordance with the present invention as shown in FIG. 4. The starting address is assumed to be "(MSB)000 . . . 000(LSB)" and the ending address is assumed to be "(MSB)0111 . . . 111(LSB)". The frame buffer zone is in the range of "000 . . . 000" and "0111 . . . 110", where the starting address As is latched in the starting address register 80 and the ending address Ae+1 is latched in the ending address register 82.

A HIGH level of signal REF for controlling the refreshing operation is enabled, so that the switches 70 are turned off and the transmission switches 72 are turned on. The clock signal CK is sent to the counter 90 whose initial status is "000 . . . 000". Because the comparison apparatus 84 is at its "LOW" level, the signal output from the inverter 92 is at its "HIGH" level. Thus, the initial state of the switches 94 is ON. The latches 96 latch 000 . . . 000". The comparison apparatus 84 finds that the "000 . . . 000" and the starting address As are the same, and generates a "HIGH" level of signal. The inverter 92 inverts the "HIGH" level of signal input from the comparison apparatus 84 to a "LOW" level C1 while the AND gate 86 generates a "HIGH" level of signal C2. Then, the switches 94 are turned off and the switches 88 are turned on. "011 . . . 111" stored in the ending address register 82 is latched in the latches 96. The switches 98 latch the addresses latched at the latches 96 to the latches 100. The switches 72 transmit the "011 . . . 111" latched at the latches 100 to the column address decoder 52.

In addition, "011 . . . 111" latched in the latches 96 is transmitted to the comparison apparatus 84 which compares "000 . . . 000" and "011 . . . 111" and determines that they are different, to thereby generate a "LOW" level of the signal C1. The inverter 92 inverts the "LOW" level of signal C1 to its "HIGH" level, and the AND gate 86 generates a "HIGH" level of signal C2. Then, the switches 96 are turned on, and the switches 88 are turned off. The signal output from the counter 90 is transmitted through the switches 94 to the latches 96. However, the previously latched address is "011 . . . 111", so that the counter 90 counts up from the address after the addresses Ai. Therefore, the DRAM refreshing operation is performed in all the other zones 42 except the frame buffer zone 40.

Figure 6:
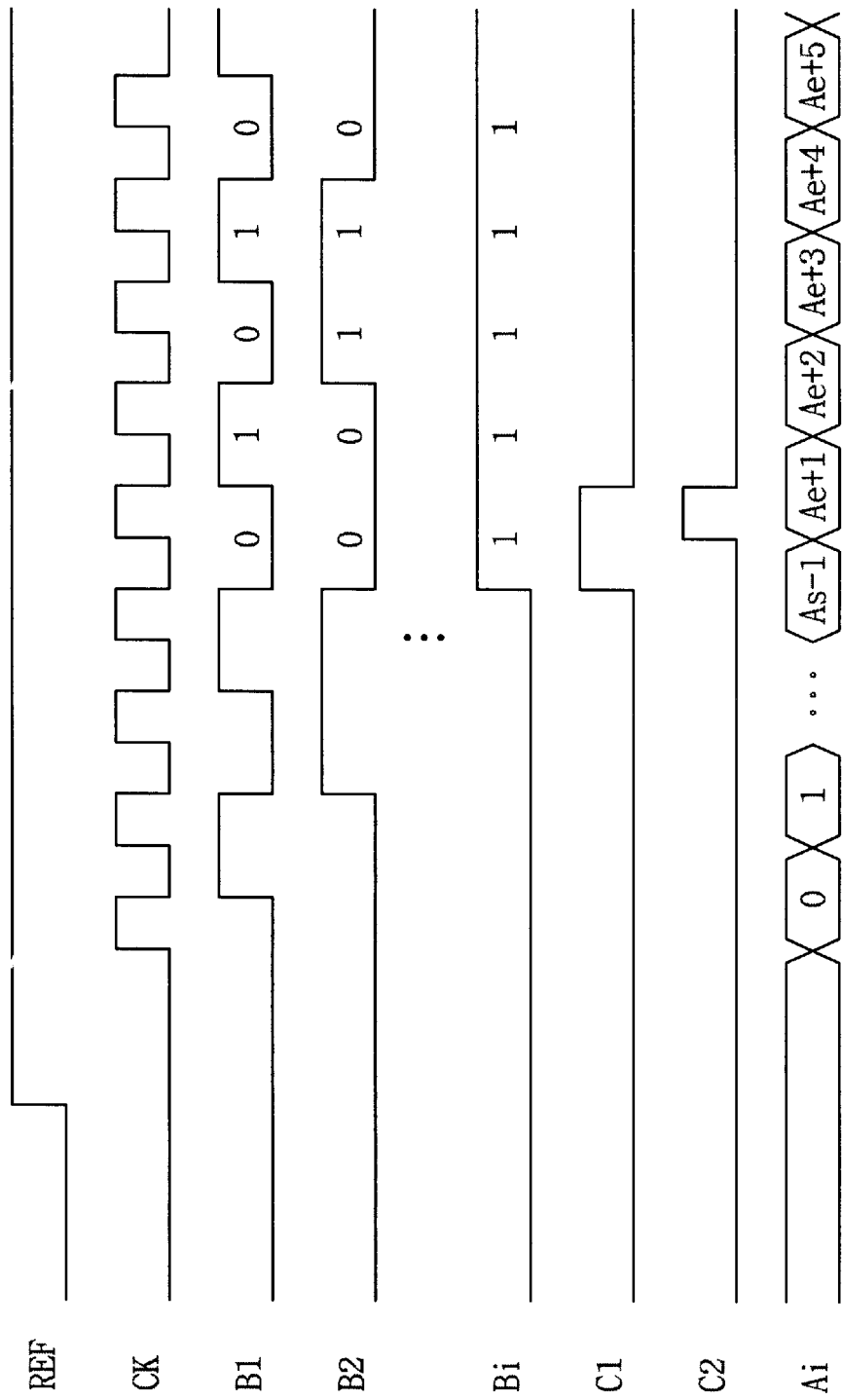

FIG. 6 is another operational timing diagram of DRAM refreshing operations in accordance with the present invention shown in FIG. 4. The starting address is assumed to be "(MSB)100 . . . 000(LSB)" and the ending address +1 is assumed to be "(MSB)111 . . . 101(LSB)". The frame buffer zone is in the range of "100 . . . 000" and "111 . . . 100". The starting address As<1:i> is latched in the starting address register 80, and the ending address Ae<1:i>+1 is latched in the ending address register 82.

The operational timing diagram in FIG. 6 illustrates the DRAM refreshing operation when the frame buffer zone is located in the central part of the graphic memory apparatus. In addition, FIG. 6 shows how the circuit in FIG. 4 accurately generates the DRAM refreshing addresses for the DRAM refreshing operation.

As shown in FIGS. 5 and 6, graphic memory apparatus and methods of the present invention may generate the DRAM addresses only to the zones that need a DRAM refreshing operation. Power and/or efficiency thereby can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of controlling refreshing operations of a Dynamic Random Access Memory (DRAM) device in a graphic memory apparatus, the DRAM device being divided into a frame buffer zone that supplies pixel data for a display and at least one other zone, the controlling method comprising the step of:

bypassing refreshing of the frame buffer zone when carrying out a refreshing operation on the DRAM device.

2. A method according to claim 1 wherein the at least one other zone comprises a z buffer zone and a texture storing zone, the bypassing step comprising the step of refreshing the z buffer zone and the texture storing zone of the DRAM while bypassing refreshing of the frame buffer zone.

3. A method according to claim 1 wherein the bypassing step comprises the steps of:

storing indications of a starting DRAM address and an ending DRAM address for the frame buffer zone; and performing a refreshing operation only of DRAM addresses that fall outside the starting address and ending address.

4. A method of controlling refreshing operations of a Dynamic Random Access Memory (DRAM) device, the controlling method comprising the step of:

always bypassing refreshing of a portion of the DRAM device when carrying out a DRAM refreshing operation on the DRAM device.

5. A method according to claim 4 wherein the bypassing step comprises the steps of:
storing indications of a starting DRAM address and an ending DRAM address for the portion of the DRAM device; and
performing a refreshing operation only of DRAM addresses that fall outside the starting address and ending address.

6. A graphics memory apparatus comprising:
a Dynamic Random Access Memory (DRAM) device that is divided into a frame buffer zone that supplies pixel data for a display and at least one other zone; and
a refreshing controller that bypasses refreshing of the frame buffer zone when carrying out a refreshing operation on the DRAM device.

7. An apparatus according to claim 6 wherein the at least one other zone comprises a z buffer zone and a texture storing zone.

8. An apparatus according to claim 6 further comprising a register that stores indications of a starting DRAM address and an ending DRAM address for the frame buffer zone, the refreshing controller performing a refreshing operation only of DRAM addresses that fall outside the starting address and ending address.

9. An apparatus according to claim 8 wherein the DRAM device includes an address decoder and wherein the refreshing controller further comprises:
a counter that counts in response to a clock signal to produce a counter output signal; and
a comparator system that compares the counter output signal to the starting address and to the ending address, to provide the counter output signal to the address decoder for the DRAM device when the output of the counter is outside the starting address and the ending address and to withhold the counter output signal from the address decoder when the counter output is between the starting address and the ending address.

10. An apparatus according to claim 9 wherein the comparator system comprises:
a first switching apparatus that transmits the indications of the ending address from the register in response to a first signal;
a second switching apparatus that transmits the counter output signal in response to an inverted second signal;
a first latching apparatus that is responsive to the first and second switching apparatus to latch the indications of the ending address or the counter output signal, the address decoder being responsive to the first latching apparatus;
a comparator that compares the counter output signal and the indication of the starting address to generate the second signal; and
an ANDing apparatus that ANDs the clock signal and the second signal to generate the first signal.

11. A memory apparatus comprising:
a Dynamic Random Access Memory (DRAM) device; and
a refreshing controller that always bypasses refreshing of a portion of the DRAM device when carrying out a DRAM refreshing operation on the DRAM device.

12. An apparatus according to claim 11 further comprising a register that stores indications of a starting DRAM address and an ending DRAM address for the portion of the DRAM device, the refreshing controller performing a refreshing operation only of DRAM addresses that fall outside the starting address and ending address.

13. An apparatus according to claim 12 wherein the DRAM device includes an address decoder and wherein the refreshing controller further comprises:
a counter that counts in response to a clock signal to produce a counter output signal; and
a comparator system that compares the counter output signal to the starting address and to the ending address, to provide the counter output signal to the address decoder for the DRAM device when the output of the counter is outside the starting address and the ending address and to withhold the counter output signal from the address decoder when the counter output is between the starting address and the ending address.

14. An apparatus according to claim 13 wherein the comparator system comprises:
a first switching apparatus that transmits the indication of the ending address from the register in response to a first signal;
a second switching apparatus that transmits the counter output signal in response to an inverted second signal;
a first latching apparatus that is responsive to the first and second switching apparatus to latch the indication of the ending address or the counter output signal, the address decoder being responsive to the first latching apparatus;
a comparator that compares the counter output signal and the indication of the starting address to generate the second signal; and
an ANDing apparatus that ANDs the clock signal and the second signal to generate the first signal.

15. A graphic memory apparatus comprising:
a Dynamic Random Access Memory (DRAM) device that is divided into a frame buffer zone that supplies pixel data for a display and at least one other zone; and
means for bypassing refreshing of the frame buffer zone when carrying out a refreshing operation on the DRAM device.

16. An apparatus according to claim 15 further comprising means for storing indications of a starting DRAM address and an ending DRAM address for the frame buffer zone, the means for bypassing comprising means for performing a refreshing operation only of DRAM addresses that fall outside the starting address and ending address.

17. A method of controlling refreshing operations of a Dynamic Random Access Memory (DRAM) device, the DRAM device being divided into a first and a second portion, the controlling method comprising the step of:
always bypassing refreshing of the first portion when carrying out a DRAM refreshing operation on the DRAM device.

18. A method according to claim 17 wherein the DRAM device is included in a graphic memory apparatus, wherein the first portion is a frame buffer zone that supplies pixel data for a display, and wherein the second portion is at least one other zone, the bypassing step comprising the step of:
bypassing refreshing of the frame buffer zone when carrying out a refreshing operation on the DRAM device.

19. A method according to claim 17 wherein the DRAM device is included in a graphic memory apparatus that supplies graphic data to a display, the bypassing step comprising the steps of:

refreshing the second portion of the DRAM device at a DRAM refreshing rate that is independent of a display refreshing rate; and refreshing the first portion of the DRAM device at a display refreshing rate that is independent of the DRAM refreshing rate.

20. A graphics memory apparatus comprising:

a Dynamic Random Access Memory (DRAM) device that is divided into a first zone and a second zone; and a refreshing controller that always bypasses refreshing of the first zone when carrying out a DRAM refreshing operation on the DRAM device.

21. An apparatus according to claim 20 wherein the first zone is a frame buffer zone that supplies pixel data for a display, and wherein the refreshing controller comprises:

a refreshing controller that bypasses refreshing of the frame buffer zone when carrying out a refreshing operation on the DRAM device.

22. An apparatus according to claim 20 wherein the refreshing controller comprises:

a refreshing controller that refreshes the second zone of the DRAM device at a DRAM refreshing rate that is independent of a display refreshing rate, and that refreshes the first zone of the DRAM device at the display refreshing rate that is independent of the DRAM refreshing rate.

23. A memory apparatus comprising:

a Dynamic Random Access Memory (DRAM) device that includes an address controller;

a refreshing controller that bypasses refreshing of a portion of the DRAM device when carrying out a refreshing operation on the DRAM device, the refreshing controller comprising:

a counter that counts in response to a clock signal to produce a counter output signal; and a comparator system that compares the counter output signal to the starting address and to the ending address, to provide the counter output signal to the address decoder for the DRAM device when the output of the counter is outside the starting address and the ending address and to withhold the counter output signal from the address decoder when the counter output is between the starting address and the ending address.

24. An apparatus according to claim 23 wherein the comparator system comprises:

a first switching apparatus that transmits the indication of the ending address from the register in response to a first signal;

a second switching apparatus that transmits the counter output signal in response to an inverted second signal;

a first latching apparatus that is responsive to the first and second switching apparatus to latch the indication of the ending address or the counter output signal, the address decoder being responsive to the first latching apparatus;

a comparator that compares the counter output signal and the indication of the starting address to generate the second signal; and an ANDing apparatus that ANDs the clock signal and the second signal to generate the first signal.

25. A graphics memory apparatus comprising:

a Dynamic Random Access Memory (DRAM) device that is divided into a frame buffer zone that supplies pixel data for a display and a second zone; and a refreshing controller that bypasses refreshing of the frame buffer zone when carrying out a refreshing operation on the DRAM device.

26. An apparatus according to claim 25 wherein the refreshing controller comprises:

a refreshing controller that refreshes the second zone of the DRAM device at a DRAM refreshing rate that is independent of a display refreshing rate, and that refreshes the frame buffer zone of the DRAM device at the display refreshing rate that is independent of the DRAM refreshing rate.

* * * * *